Oct. 25, 1960 R. L. WATTERS 2,958,046

DISTRIBUTED AMPLIFIER

Filed Feb. 29, 1960

Inventor:
Robert L. Watters,
by John F. Ahern
His Attorney.

United States Patent Office 2,958,046

Patented Oct. 25, 1960

2,958,046

DISTRIBUTED AMPLIFIER

Robert L. Watters, Schenectady, N.Y., assignor to General Electric Company, a corporation of New York Filed Feb. 29, 1960, Ser. No. 11,591

13 Claims. (Cl. 330—54)

Figures 1, 2, 3:
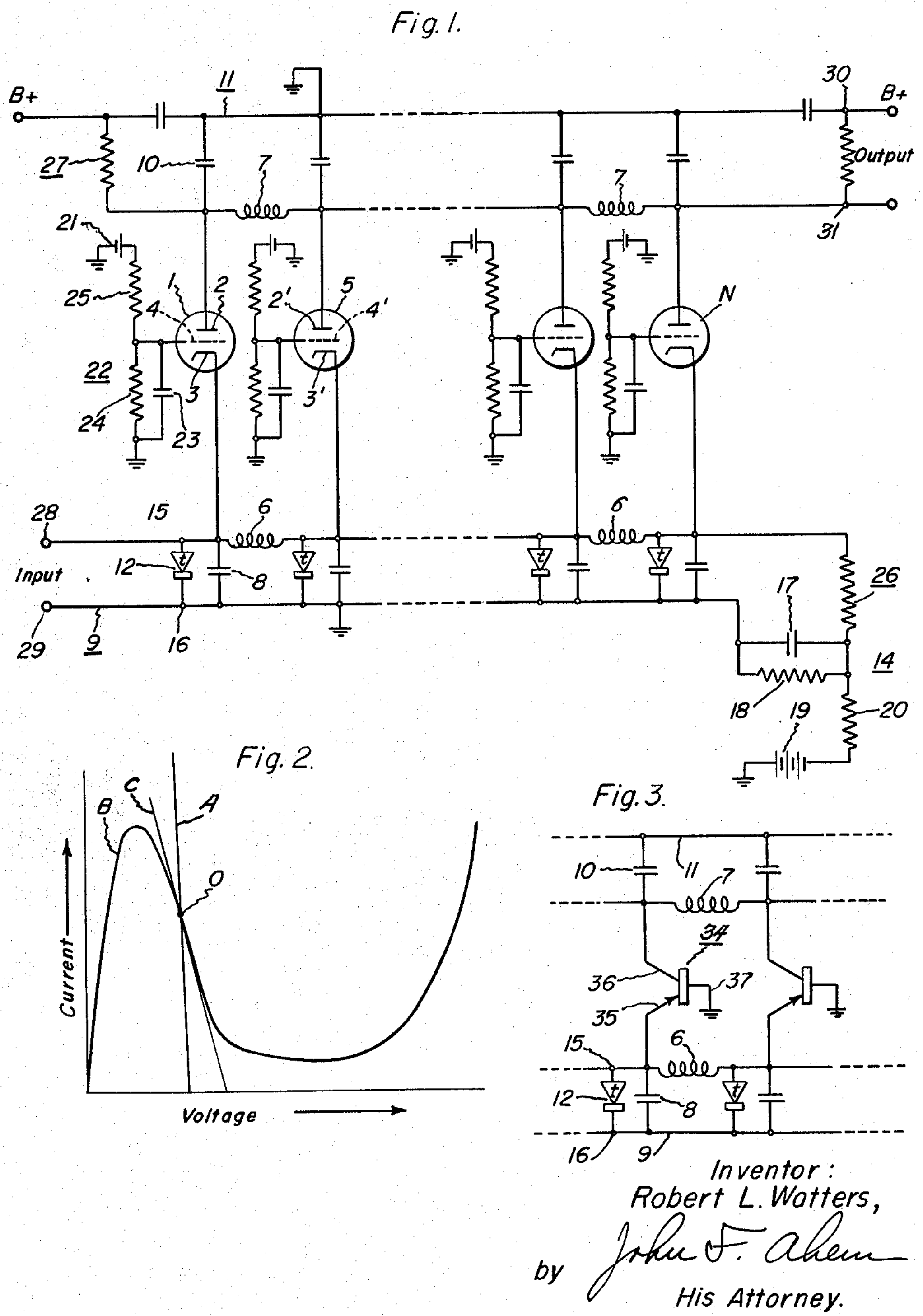

This invention relates in general to wide band amplifiers and in particular to distributed amplifiers.

Distributed amplifiers employing a plurality of electron tubes distributed along artificial transmission lines are now well-known. Such amplifiers usually utilize electron tubes of the multigrid type such as tetrodes and pentodes which include an anode, a cathode, a control electrode and at least one additional electrode.

In such an amplifier the input signal is applied to an input artificial line in which the shunt capacitance is provided by the input capacitance of the electron tubes. The control electrode of each of the electron tubes is driven in succession, the time delay depending upon the properties of the input artificial line. The anodes are connected to an output artificial line having identical delay properties and in which the shunt capacitance is provided by the output capacitance of the electron tubes. The portion of the anode current of each electron tube which travels to the output load adds in phase therein.

Because of the requirement of such an amplifier that isolation be provided between input and output circuits respectively, prior art distributed amplifiers have been limited to use with specially constructed electron tubes or conventional multigrid electron tubes which provide such isolation by means of their special construction or extra electrodes which are connected so as to provide electrostatic shielding between the control electrode and the anode. Such electron tubes, however, have a large electron transit time which has limited prior art distributed amplifiers to a maximum frequency of approximately 200 or 300 megacycles per second.

It would be most desirable, therefore, to employ a conventional amplifying device capable of operation at much higher frequencies in a distributed amplifier. Alternative amplifying devices, such as, for example, triode type electron tubes and transistors have been found to be unsuitable for use in a distributed amplifier because of their low values of input impedance.

It is an object of this invention, therefore, to provide an improved distributed amplifier which avoids one or more of the disadvantages of the prior art arrangements.

It is another object of this invention to provide a distributed amplifier using triode type vacuum tubes which is capable of obtaining amplification over a wider bandwidth than prior art distributed amplifiers.

It is still another object of this invention to utilize conventional amplifying devices which are capable of operation at extremely high frequencies in a new and improved distributed amplifier to obtain amplification at higher frequencies than any other prior art arrangement.

Briefly stated, in accord with one aspect of this invention, a distributed amplifier comprises a plurality of amplifying devices coupled in parallel relationship along input and output artificial transmission lines in which the shunt capacitance is provided by the input and output capacitance respectively, of the amplifying devices.

In further accord with this invention a narrow junction degenerate semiconductor diode is connected in parallel relation with the input of each of the amplifying devices to provide an effective input impedance which is high with respect to the characteristic impedance of the input line.

A distributed amplifier, therefore, may be constructed in accordance with this invention which provides amplification over wider bandwidths than any prior art arrangement and utilizes unilateral amplifying devices having inherently high frequency limits but which usually have too low an input impedance to be considered in forming a distributed amplifier.

The features of my invention which I believe to be novel are set forth with particularity in the appended claims. My invention itself, however, both as to its organization and method of operation, together with further objects and advantages thereof, may best be understood by reference to the following description taken in connection with the accompanying drawing in which:

Fig. 1 is a schematic circuit diagram of an electron tube distributed amplifier constructed in accord with this invention.

Fig. 2 is a graphical presentation of a current-voltage characteristic of a typical narrow junction degenerate semiconductor device, suitable for use in the practice of this invention, together with a direct current load line therefor, and, Fig. 3 is a schematic circuit diagram of a portion of a distributed amplifier of this invention utilizing transistors as the amplifying devices in each section.

The semiconductor device used in the practice of this invention is a narrow junction degenerate semiconductor diode or so-called "tunnel diode." Such diodes are semiconductor devices including a single P–N junction and exhibiting a region of negative resistance in the low forward voltage range of their current-voltage characteristics.

Such devices are fabricated so as to provide regions of P and N-type conductivity having a very narrow junction therebetween, both of the regions being "degenerate." The use of the term "degenerate" refers to a body or region of semiconductive material which, if N-type, contains a sufficient concentration of excess donor impurity to raise the "Fermi-level" thereof to a value of energy higher than the minimum energy of the conduction band on the energy band diagram of the semiconductive material. In a P-type semiconductive body or region, degeneracy means that a sufficient concentration of excess acceptor impurities are present therein to depress the "Fermi-level" to an energy lower than the maximum energy of the valence band on the energy band diagram for the semiconductive material. The "Fermi-level" in such an energy band diagram is the energy level at which the probability of there being an electron present is equal to one half.

The forward voltage range of the current-voltage characteristic of such a device at which the negative resistance region appears varies depending upon the semiconductive material from which the device is fabricated. For example, the range of the negative resistance region for a germanium device is from about 0.04 to 0.3 volt while for gallium arsenide the range is from about 0.12 to 0.5 volt. It appears that the negative resistance of such a device is independent of frequency from zero cycles (direct current) to well beyond the microwave frequencies.

For further details concerning the narrow junction degenerate semiconductor device utilized in the practice of this invention, reference may be had to the copending application of Jerome J. Tiemann, Serial No. 858,995, filed December 11, 1959, which is assigned to the assignee of the present invention and incorporated herein by reference.

In its simplest form the distributed amplifier comprises a plurality of amplifying devices distributed along artificial transmission lines. In most amplifying devices there is a capacity effect between electrodes which is effectively in shunt with the external circuit connected thereto. It is this capacity, associated with both the input and output of the amplifying devices, together with the inductances used to couple them, which produces the input and output artificial transmission lines.

In order for such artificial lines to be established however, the amplifying devices used must have a high input impedance and provide good isolation between their input and output circuits. In multigrid electron tubes, such as usually employed in prior art distributed amplifiers, the signal is impressed on the control electrode, to assure a high impedance, and extra control electrodes provide the required electrostatic shielding to isolate the input and output circuits.

It has been determined that the upper frequency limit of such a distributed amplifier arrangement is set by the frequency limit of the amplifying device itself. For this reason it would be desirable to employ amplifying devices known to have inherently high upper frequency limits to provide a distributed amplifier capable of operation over an extremely wide band of frequencies. In many cases, however, such amplifying devices have such low input impedances that no artificial transmission line configuration can be established. Further, the entire concept of the distributed amplifier is based upon the assumption that the artificial transmission lines are non-dissipative so that any such low value of input impedance at once violates this premise. For example, a low input impedance would appear in the amplifier circuit as a low resistance across the input artificial line, completely destroying the desired artificial transmission line configuration.

One example of an amplifying device having a high upper frequency limit is the triode type electron tube. It is well-known that certain electron tubes of this type have small electron transit times and are, therefore, capable of operation at extremely high frequencies. This is especially true when such an electron tube is utilized in the "grounded grid configuration." Such electron tubes, however, have very low input impedances, especially when used in the grounded grid arrangement. Since isolation between input and output are required for use in a distributed amplifier, if a triode type electron tube is used, it must be used in the grounded grid configuration to provide the desired electrostatic shielding. This requires the input circuit to be connected to the cathode, the impedance of which is very low, usually on the order of 100 ohms or less. In the case of other amplifying devices such as transistors and the like the input impedance may be on the order of 20 ohms. Such low input impedances preclude the use of such devices in a distributed amplifier arrangement. It is apparent that input impedances considerably higher than those mentioned above are still too low for a distributed amplifier arrangement and the cited values are given by way of example only.

Referring now to Fig. 1 of the drawing, there is shown therein a circuit diagram of a number of sections of a distributed amplifier in accord with this invention. A "section" as used herein refers to an amplifying device and its portion of transmission line. A plurality of such sections forms a "stage." By way of example only, Fig. 1 shows the amplifying device in each section as a triode type electron tube. It is readily apparent, however, that other amplifying devices may be used, as for example, transistors and other unilateral amplifying devices which are suitable for extremely high frequency operation. For ease of understanding, however, the invention will be described in detail with respect to Fig. 1.

The amplifier shown in Fig. 1 comprises a plurality of sections each including an amplifying device, such as for example, triode type electron tube 1 having an anode 2, a cathode 3 and a control electrode 4. Cathode 3 is connected to the cathode 3' of the adjacent electron tube 5 by means of inductance 6. Anode 2 is connected to the anode 2' of adjacent electron tube 5 by means of inductance 7.

The combination of inductance 6 with the input capacitance 8 of electron tube 1 forms a portion of a first artificial transmission line 9 and the combination of inductance 7 and the output capacitance 10 of electron tube 1 forms a portion of a second artificial transmission line 11. For convenience transmission lines 9 and 11 may be referred to herein as input and output transmission line respectively. The values of inductances 6 and 7 are selected such that the transmission lines of which they are a part have the same velocity of propagation. The input and output capacitances 8 and 10 respectively, are determined by the particular amplifying devices utilized so that the above requirement of providing the same velocity of propagation can be met by employing well-known conventional transmission line techniques. The values of inductances 6 and 7 depend, therefore, upon such factors as how high a frequency it is desired to operate the amplifier and the particular amplifying devices selected. For example, the cut-off frequency of such an artificial transmission line is determined by $$\frac{1}{\sqrt{LC}}$$

Therefore, with the value of capacitance 10 fixed by the particular amplifying device chosen, the value of inductance 7 is selected accordingly to obtain a cut-off frequency higher than the highest frequency at which amplification is required. As shown above, since the velocity of propagation of the two lines must be the same, the value of inductance 6 must be proportioned so that its combination with capacitance 8 produces this result.

Connected in parallel with the input impedance of electron tube 1, across the artificial transmission line 9, is a narrow junction degenerate semiconductor diode 12. Bias means, generally designated at 14, provides that the voltage between terminals 15—16 of diode 12 is such that a direct current load line is established which intersects the diode current-voltage characteristic in the negative resistance region. An illustration of such a load line is shown at A of Fig. 2 intersecting the current-voltage characteristic B at the point 0 in the negative resistance region. For purposes of this explanation, curve B is to be assumed to represent a composite current-voltage characteristic of all diodes connected in parallel along input transmission line 9. Bias means 14 includes by-pass capacitor 17 and parallel resistance 18 connected to the negative side of a direct current voltage source 19 through resistance 20. Capacitance 17 serves as a by-pass for alternating current.

Control electrode 4 may be connected to an appropriate voltage source 21 to provide a bias voltage for electron tube 1 in addition to isolation between anode 2 and cathode 3 and a ground plane therebetween for alternating current. In addition this provides a convenient means of adjustment to compensate for any unbalance caused by differences among amplifying devices. A conventional bias arrangement may be such as designated generally at 22. This bias arrangement shows a parallel combination of by-pass capacitor 23 and resistance 24 connected to a source of direct current 21 through resistance 25. By-pass capacitor 23 provides ground potential for alternating current. While resistance 25 is shown connected to the positive side of voltage source 21 it is to be appreciated that it may be connected to either positive or negative depending upon the particular value of the negative voltage 19. Alternatively, control electrode 4 may be directly connected to ground potential if desired. While the circuit configuration of only one section of my improved distributed amplifier has been described in detail, all sections are similar and, therefore, no further description is deemed necessary.

The distributed amplifier of Fig. 1 shows a plurality of triode type electron tubes distributed along artificial transmission lines 9 and 11. In general, it is to be assumed that artificial transmission lines 9 and 11 are terminated by means of appropriate half-sections and resistors equal to the characteristic impedance of the line when uniform amplification over a wide band of frequencies is desired or of a value different than the characteristic impedance, if it is desired to discriminate in favor of a particular frequency or band of frequencies. Such termination techniques are conventional and well-known in the art and, therefore, will not be described in further detail herein. The input transmission line 9 is terminated by its appropriate impedance generally designated at 26 while output transmission line 11 is terminated in impedance 27.

In operation, a wave at the input terminals 28—29 of the distributed amplifier of Fig. 1 travels along the input transmission line 9 to the cathodes of the respective electron tubes 1 to N. As the wave reaches the cathodes of each of the tubes, currents flow in each of the anode circuits thereof and each tube sends waves in the output transmission line 11 in both directions. Since the terminating impedance 27 has been selected equal to the characteristic impedance of line 11, the waves which travel from each anode toward the end of the line terminated thereby are completely absorbed and thus in no way contribute to the output. The waves which travel from each anode toward the output terminals 30—31, however, all add in phase with each other. This is due to the arrangement of the paths between input and output and the fact that the velocity of propagation of both transmission lines 9 and 11 are the same. For example, the wave travels from the anode of tube 1 and reaches the anode of tube 5 at the same time that the input signal has produced current flow in the anode circuit of tube 5 and the waves add together. The output of the amplifier, therefore, is directly proportional to the number of sections used.

At each section the input impedance is equal to the parallel combination of the negative resistance of the narrow junction degenerate semiconductor diode and the input impedance of the particular amplifying device utilized. This effective input impedance may be shown by the relation:

$$Z_{in}=\frac{R_1(-R)}{R_1+(-R)}$$

where $Z_{in}$=effective input impedance of the combination
$R_1$=input impedance of the amplifying device
$(-R)$=negative resistance of the narrow junction diode Thus, this value may be made large without effecting the properties of the input line.

From this relationship, it can be seen that as the input impedance of the amplifying device approaches the value of the negative resistance of the narrow junction degenerate semiconductor diode the effective input impedance approaches an infinitely large value.

Diode 12 is selected, therefore, to have an absolute value of negative resistance, larger than, but very near the input impedance of the amplifying devices utilized, such that the impedance of the parallel combination of the input impedance of the amplifying device and the negative resistance of diode 12 is large compared to the characteristic impedance of the line. How high the value of this effective impedance is to be made depends upon such factors as the number of amplifying devices used in the amplifier and the amount of gain desired from each section. For example, the larger the input impedance of each section compared to the characteristic impedance of the line, the less loss at each section. Fig. 2 shows alternating current load line C having very nearly the same slope as that of the negative resistance characteristic so that for this condition the input impedance is extremely large since $R_1$ is then very nearly equal to $-R$.

For many present day narrow junction degenerate semiconductor diodes, the current flowing in the amplifying devices, within their desired operating range, may be larger than the value required to produce a load line which properly intersects the current-voltage characteristic of diode 12 in the negative resistance region. For this reason, bias means are provided to establish a voltage between the terminals 15—16 of diode 12 such that it operates in the low forward voltage range in which the negative resistance appears and thus provides the desired negative resistance.

In the circuit of Fig. 1 this bias means is shown generally at 14. Resistance 20 is connected to the negative side of source of direct current voltage 20 and, in combination with resistance 18 and capacitance 17, provides the necessary potential difference between terminals 15—16 of diode 12 to assure that a load line is established which intersects the current-voltage characteristic in the negative resistance region. The current flowing through tube 1 divides and part flows through the inductances 6, terminating resistance 26 and resistance 20 to voltage source 19. The other portion of the current flows through diode 12. This arrangement provides the required bias for diode 12 to assure operation in the negative resistance region of the current-voltage characteristic. For example, for a particular narrow junction diode fabricated from germanium and having a negative resistance region in the forward voltage range of approximately 0.04 to 0.3 volt, a suitable voltage selected across terminals 15—16 may be approximately 0.1 volt. This value will, of course, vary depending upon the particular narrow junction diode used since the range of the negative resistance region depends upon the particular material from which the diode is fabricated. Alternatively, if the diode chosen is such that the desired value of negative resistance is obtained directly from the current flowing in each amplifying device, then no additional bias means need be used. Further, if desired, an appropriate bias may be provided by means of a resistance shunting each diode to provide a by-pass for any current flowing in the amplifying device in excess of that required to provide the desired negative resistance. This latter bias means is useful, when, in a particular case, it is desired to have uniform frequency response from zero cycles (direct current) to a predetermined high frequency limit. The bias means shown at 14, while providing for operation to very low frequencies, would not allow the range to extend as far as direct current. With presently available triode type electron tubes the distributed amplifier of this invention is capable of producing amplification from zero cycles to approximately 1000 megacycles per second.

Fig. 3 shows a portion of a distributed amplifier in accord with this invention wherein the amplifying devices in each section are transistors rather than electron tubes. Transistor 34 includes an emitter electrode 35, a collector electrode 36 and a base electrode 37. In the common base configuration as shown, emitter 35 is connected to input transmission line 9, collector electrode 36 is connected to output transmission line 11 and base electrode 37 connected to ground potential.

Narrow junction diode 12 is connected in parallel with the input of transistor 34 to provide a high input impedance in accordance with the invention as set forth fully in the detailed description of Fig. 1. Any suitable bias means may be utilized which provides appropriate operating voltages for the transistors and at the same time provides a potential difference across terminals 15—16 such that a load line is established which intersects the current-voltage characteristic in the negative resistance region. Such bias may be provided by separate means as in Fig. 1 or a single bias means which meets these requirements may be employed. Alternatively, as for the distributed amplifier utilizing electron tubes, the desired bias may be provided in appropriate arrangements by the current flow in the transistor itself. It is to be appreciated that either P-N-P or N-P-N transistors may be employed. The operation of the distributed amplifier utilizing transistors as the amplifying devices in each section is similar to that described fully above in reference to Fig. 1.

With the increasing production and advances in the art of fabricating narrow junction degenerate semiconductor diodes, entire families of such devices are becoming available. A particular diode may easily be selected, therefore, which has a value of negative resistance very nearly the same as the input impedance of the particular amplifying device to be used so that the input impedance of each section may be made very large. In addition, for many applications a narrow junction diode may be selected which has the desired load line established in the negative resistance region by the current flow from the amplifying device itself and no additional bias means need be provided.

Only the basic distributed amplifier of this invention has been described herein, however, it is to be appreciated that conventional techniques such as cascading of stages, more efficient line termination and other methods of increasing the gain or efficiency of known distributed amplifiers may likewise be applied to this new and improved distributed amplifier.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A distributed amplifier comprising: an input transmission line; an output transmission line; a plurality of amplifying devices having their inputs and outputs coupled in parallel relationship along said transmission lines; a plurality of narrow junction degenerate semiconductor diodes each exhibiting a negative resistance region over a portion of its current-voltage characteristic, one of said diodes connected in parallel with the input of each of said amplifying devices; and bias means in circuit with said diodes providing operation therefor in said negative resistance region.

2. A distributed amplifier comprising: an input transmission line; an output transmission line; a plurality of amplifying devices having their inputs and outputs coupled in parallel relationship along said transmission lines, each of said amplifying devices being capable of operation at high frequencies and having a low input impedance; a plurality of narrow junction degenerate semiconductor diodes each exhibiting a negative resistance region over a portion of its current-voltage characteristic; bias means in circuit with said diodes providing operation therefor in said negative resistance region; and means connecting one of said diodes in parallel with the input of each of said amplifying devices to increase the input impedance thereof to a predetermined value.

3. A distributed amplifier comprising: an input transmission line; an output transmission line; a plurality of amplifying devices having their inputs and outputs coupled in parallel relationship along said transmission lines, each of said devices being capable of operation to a frequency of at least 1000 megacycles per second; a plurality of narrow junction degenerate semiconductor diodes each exhibiting a negative resistance region over a portion of its current-voltage characteristic; bias means in circuit with said diodes providing operation therefor in said negative resistance region; and means connecting one of said diodes in parallel with the input of each of said amplifying devices to increase the input impedance thereof to a predetermined high value.

4. The distributed amplifier of claim 1 wherein the amplifying devices are triode type electron tubes.

5. The distributed amplifier of claim 1 wherein the amplifying devices are transistors.

6. A distributed amplifier comprising: a plurality of transistors each including emitter, collector and base electrodes; input and output transmission lines coupling the inputs and outputs of said transistors in parallel relation, said input transmission line including the input capacitances of said transistors and the inductances therebetween, said output transmission line including the output capacitances of said transistors and the inductances therebetween; a plurality of narrow junction degenerate semiconductor diodes, one connected in parallel with the input of each of said transistors; and bias means for said diodes and said transistors to provide operating voltages on the transistor electrodes and a forward voltage on each of said diodes such that a direct current load line is established therefor which intersects the current-voltage characteristic of said diode in the negative resistance region.

7. A distributed amplifier comprising: a plurality of amplifying devices; first and second artificial transmission lines coupling the input and output terminals of said amplifying devices respectively to provide a parallel arrangement therefor, said first artificial transmission line including inductances between adjacent input terminals of said devices and the input capacitances thereof, said second artificial transmission line including inductances between adjacent output terminals of said amplifying devices and the output capacitances thereof; means terminating said first and second transmission lines; means for impressing an input on said first artificial transmission line; means for taking an output from said second artificial transmission line; a plurality of narrow junction degenerate semiconductor diodes each exhibiting a region of negative resistance at the low forward voltage range of its current-voltage characteristic; means connecting one of said diodes in parallel with the input impedance of each of said amplifying devices; and means biasing said diode to establish a direct current load line therefor which intersects said current-voltage characteristic in the negative resistance region thereof such that the impedance of the combination of the diode negative resistance and input impedance of the amplifying device is large compared to the characteristic impedance of said first artificial transmission line.

8. A distributed amplifier comprising: a plurality of amplifying devices; input and output artificial transmission lines coupling said amplifying devices in parallel circuit relationship, said input transmission line being made up of the input capacitances of said amplifying devices and the inductance between input terminals thereof, said output transmission line being made up of the output capacitance of said amplifying devices and the inductances between the output terminals thereof; means terminating said transmission lines in their respective characteristic impedances; a plurality of narrow junction degenerate semiconductor diodes which exhibit a region of negative resistance at the low forward voltage range of their current-voltage characteristic; means connecting one of said diodes in parallel relation with the input impedance of each of said amplifying devices; and bias means establishing a direct current load line for said diode which intersects said current-voltage characteristic in the region of negative resistance such that the parallel combination of the negative resistance of said diode and the input impedance of said amplifying device provides an effective input impedance which is large compared to the characteristic impedance of said first artificial transmission line.

9. A distributed amplifier comprising: a plurality of electron tubes each having an anode, a cathode and a control electrode; a plurality of inductive means coupling all cathodes together and all anodes together to arrange said electron tubes in parallel circuit relationship, said means including sufficient inductance to provide that the input and output capacitances of said electron tubes and said inductances form input and output artificial transmission lines respectively having substantially the same velocity of propagation; means terminating said artificial transmission lines; a plurality of narrow junction degenerate semiconductor diodes each exhibiting a region of negative resistance at the low forward voltage range of its current-voltage characteristic, one of said diodes connected in parallel with the input impedance of each of said electron tubes; bias means for said diodes establishing a direct current load line which intersects said characteristic in the region of negative resistance such that the alternating current load line established by the input impedance of said electron tube and having a slope very nearly the same as the slope of said negative resistance characteristic passes through said intersection to provide that the effective input impedance of each of said electron tubes produced by the combination of the input impedance of said electron tube and the negative resistance of said diode is large compared to the characteristic impedance of said second artificial transmission line.

10. A distributed amplifier comprising: a plurality of triode-type electron tubes each having a cathode, an anode and a control electrode; input and output artificial transmission lines coupling said tubes in parallel relation, said input artificial transmission line being made up of the input capacitances of said tubes and the inductance between the cathodes thereof, said output artificial transmission line being made up of the output capacitances of said tubes and the inductance between the anodes thereof; means for terminating said input and output transmission lines in the respective characteristic impedance thereof; first bias means to provide a direct current-voltage on each of said control electrodes and isolation between the anodes and cathodes of said tubes; a plurality of narrow junction degenerate semiconductor diodes each exhibiting a region of negative resistance at the low forward voltage range of its current-voltage characteristic, the absolute value of said negative resistance being very near the value of the input impedance of said electron tube; one of said diodes connected in parallel relation with the input impedance of each of said electron tubes; and second bias means establishing a direct current load line for said diode which intersects said current-voltage characteristic in the negative resistance region thereof to provide an input impedance at each electron tube which is large compared to the characteristic impedance of the first artificial transmission line.

11. In a distributed amplifier wherein a plurality of amplifying devices are coupled in parallel relationship between input and output artificial transmission lines which include the capacitances of said devices and the inductances therebetween to provide a separation of the capacitance of each of said devices while adding the transconductance thereof the combination with such artificial transmission lines comprising: a plurality of electron tubes each having an anode, a cathode and a control electrode; each of said cathodes coupled to said input artificial transmission line; each of said anodes coupled to said output artificial transmission line; each of said control electrodes having a direct current-voltage thereon sufficient to provide bias for said electron tube and isolation between said anode and cathode; a narrow junction degenerate semiconductor diode exhibiting a region of negative resistance in the low forward voltage range of its current-voltage characteristic connected in parallel circuit relation with the input impedance of each of said tubes; and bias means for said diode establishing a direct current load line which intersects said current-voltage characteristic in the region of negative resistance and at a position therein such that the effective impedance of the parallel combination of the input impedance and the negative resistance of said diode is large compared to the characteristic impedance of said first artificial transmission line.

12. In a distributed amplifier wherein a plurality of amplifying devices are coupled in parallel relationship between input and output artificial transmission lines which include the capacitances of said devices and the inductances therebetween to provide a separation of the capacitance of each of said devices while adding the transconductance thereof the combination with such artificial transmission lines comprising: a plurality of triode-type electron tubes each having an anode, a cathode and a control electrode; each of said cathodes coupled to said input transmission line; each of said anodes coupled to said output transmission line; each of said control electrodes connected to ground potential to provide isolation between the anode and cathode of each of said electron tubes; a narrow junction degenerate semiconductor diode in parallel circuit relation with the input impedance of each of said tubes, said diode exhibiting a region of negative resistance in the low forward voltage range of its current-voltage characteristic; and bias means for said diode establishing a direct current load line therefor which intersects said current-voltage characteristic in the region of negative resistance to provide that the impedance of the parallel combination of the input impedance of said tube and the negative resistance of said diode is large compared to the characteristic impedance of said input transmission line.

13. A distributed amplifier comprising: an input transmission line; an output transmission line; a plurality of amplifying devices coupled in parallel relationship along said transmission lines; a narrow junction degenerate semiconductor diode connected in parallel with the input of each of said amplifying devices, each of said diodes exhibiting a region of negative resistance at the low forward voltage range of its current-voltage characteristic, the absolute value of said negative resistance being very nearly the same as the input impedance of each of said amplifying devices; and bias means for said diode establishing a direct current load line which intersects said characteristic in the negative resistance region.

No references cited.